(12) United States Patent
Xiong et al.

(10) Patent No.: US 7,897,994 B2
(45) Date of Patent: Mar. 1, 2011

(54) METHOD OF MAKING (100) NMOS AND (110) PMOS SIDEWALL SURFACE ON THE SAME FIN ORIENTATION FOR MULTIPLE GATE MOSFET WITH DSB SUBSTRATE

(75) Inventors: Weize Xiong, Austin, TX (US); Cloves Rinn Cleavelin, Dallas, TX (US); Angelo Pinto, Allen, TX (US); Rick L. Wise, Fairview, TX (US)

(73) Assignee: Texas Instruments Incorporated, Dallas, TX (US)

( * ) Notice: Subject to any disclaimer, the term of this patent is extended or adjusted under 35 U.S.C. 154(b) by 255 days.

(21) Appl. No.: 11/764,442

(22) Filed: Jun. 18, 2007

(65) Prior Publication Data

US 2008/0308847 A1    Dec. 18, 2008

(51) Int. Cl.
*H01L 29/66* (2006.01)

(52) U.S. Cl. .................. 257/119; 257/68; 257/288; 257/900; 257/E29.264

(58) Field of Classification Search .......... 257/68, 257/119, 288, 900, E29.264
See application file for complete search history.

(56) References Cited

U.S. PATENT DOCUMENTS

2007/0052027 A1* 3/2007 Ke et al. ............... 257/351
2008/0079003 A1* 4/2008 Shaheen et al. ......... 257/64

* cited by examiner

*Primary Examiner*—N Drew Richards
*Assistant Examiner*—Joannie A Garcia
(74) *Attorney, Agent, or Firm*—Warren L. Franz; Wade J. Brady, III; Frederick J. Telecky, Jr.

(57) ABSTRACT

A method of forming an integrated circuit device that includes a plurality of MuGFETs is disclosed. A PMOS fin of a MuGFET is formed on a substrate. The PMOS fin includes a channel of a first surface of a first crystal orientation. A NMOS fin of another MuGFET is formed on the substrate. The NMOS fin includes a channel on the substrate at one of 0° and 90° to the PMOS fin and includes a second surface of a second crystal orientation.

14 Claims, 4 Drawing Sheets

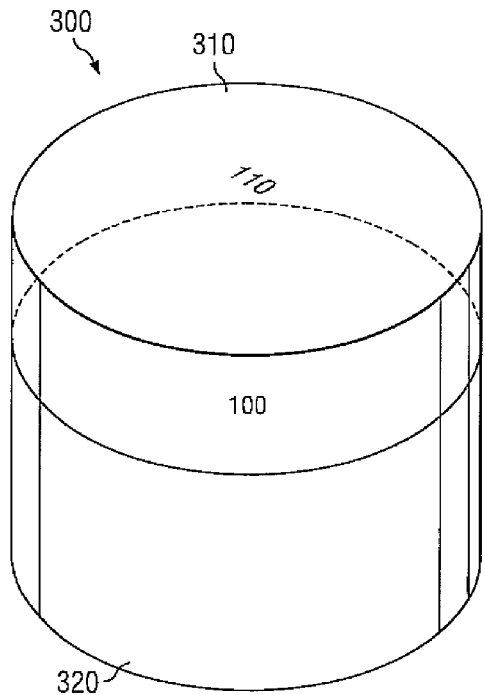
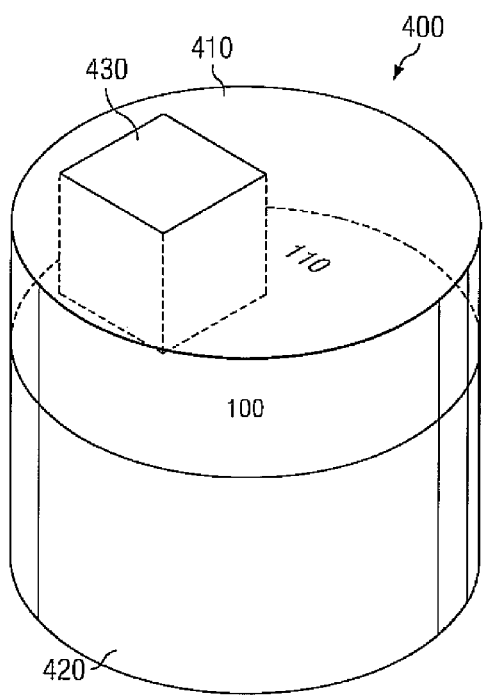
FIG. 3
FIG. 4
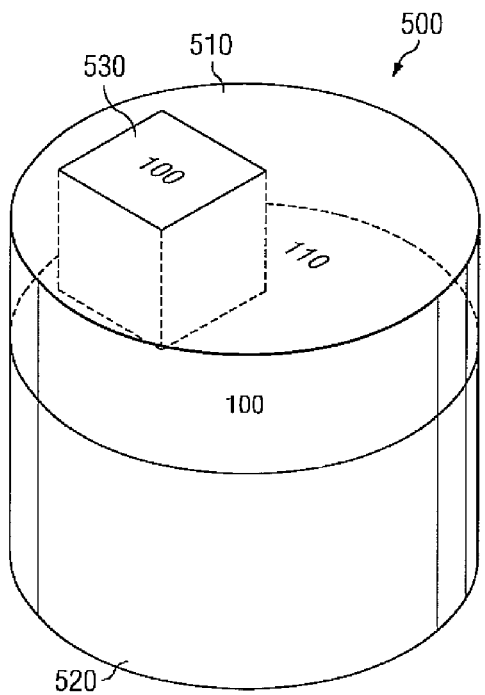
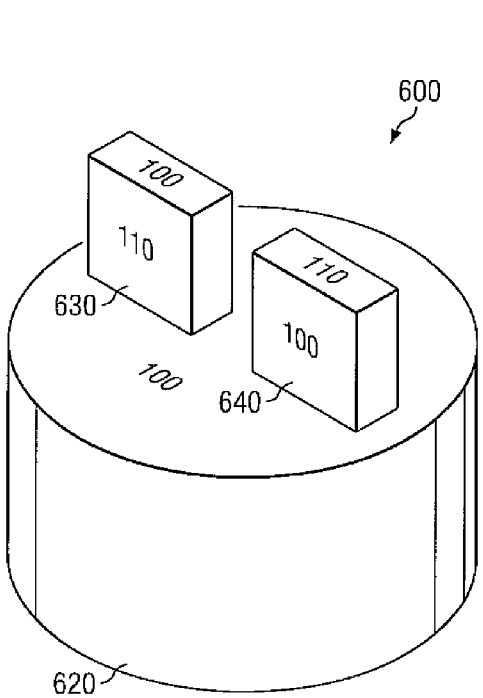
FIG. 5
FIG. 6

METHOD OF MAKING (100) NMOS AND (110) PMOS SIDEWALL SURFACE ON THE SAME FIN ORIENTATION FOR MULTIPLE GATE MOSFET WITH DSB SUBSTRATE

FIELD

The subject matter of the teachings disclosed herein relates to methods of improving layout of an integrated circuit. More particularly, the subject matter of the teachings disclosed herein relates to improving the layout of a MuGFET based integrated circuit.

BACKGROUND

Conventionally, a layout of a semiconductor device, e.g., an SRAM, using Multi-Gate Field Effect Transistor (MuG-FET) technology is conducted in a non-Manhattan layout. Portions of the layout must be rotated by 45° to accommodate for the conductivity of the substrate surface.

FIG. 1 shows a conventional layout for a MuGFET.

In particular, a MuGFET 100 is constructed of a fin 130 straddled by a gate or notch 120. The fin 110 and notch 120 are formed over a semiconductor substrate 140, e.g., $SiO_2$.

The MuGFET 100 channels are on the sidewalls 150 of the fin 130. For a normal <110> notch (001) surface wafer, the sidewall 150 of the fin 130 are (110) if a fin 130 is laid at 0 or 90 degree rotations with respect to the notch 120. If the rotation of the fin 130 with respect to the notch 120 is 45 degrees, the fin 130 sidewalls 150 are (100).

The (110) surface is good for hole mobility but poor for electron mobility, while the (100) surface is poor for hole mobility but good for electron mobility. To gain access to both surfaces, mixed rotations of the fins 130 with respect to notches 120 of 0 and 45 degrees are necessary. Such mixed rotations increase the layout area of an integrated circuit device by approximately 25% and increase lithography difficulties.

FIG. 2 shows an example top-level view of a non-Manhattan layout of a static random access memory (SRAM) relying on MuGFET technology.

In particular, example SRAM 200 is constructed of a plurality of fins 210 and notchs 220. The fins 210 are connected to other components of the SRAM 200 through contact patches 215. The notches 220 are connected to other components of the SRAM 200 through contact patches 225.

Measurements for the example SRAM 200 are taken from a centerline of the fin contact patches 215 and the centerline of the notch contact patches 225. Using industry standards for spacing between the various components of SRAM 200, the dimensions for the example SRAM 200 are approximately 500 nm by approximately 812.5 nm. Thus, the layout area for the example SRAM 200 is approximately 406,250 $nm^2$.

Accordingly, the present teachings solve these and other problems of the prior art's problems with laying out a MuG-FET based semiconductor device.

SUMMARY

In accordance with the teachings, a method of forming an integrated circuit device that includes a plurality of MuG-FETs is disclosed. A PMOS fin of a MuGFET is formed on a substrate. The PMOS fin includes a channel of a first surface of a first crystal orientation. A NMOS fin of another MuGFET is formed on the substrate. The NMOS fin includes a channel on the substrate at one of 0° and 90° to the PMOS fin and includes a second surface of a second crystal orientation.

In accordance with the teachings, an integrated circuit device is disclosed that includes a plurality of Multi-Gate Field Effect Transistors (MuGFETs). The integrated circuit includes a substrate and a PMOS fin of a MuGFET on the substrate, with the PMOS fin including a first surface of a first crystal orientation. An NMOS fin of another MuGFET is included on the substrate, with the NMOS fin including a second surface of a second crystal orientation and oriented at one of 0° and 90° to the PMOS fin on the substrate.

Additional advantages of the embodiments will be set forth in part in the description which follows, and in part will be obvious from the description, or may be learned by practice of the teachings disclosed herein. The advantages will be realized and attained by means of the elements and combinations particularly pointed out in the appended claims.

It is to be understood that both the foregoing general description and the following detailed description are exemplary and explanatory only and are not restrictive of the teachings disclosed herein, as claimed.

The accompanying drawings, which are incorporated in and constitute a part of this specification, illustrate embodiments of the teachings disclosed herein and together with the description, serve to explain the principles of the teachings disclosed herein.

BRIEF DESCRIPTION OF THE DRAWINGS

FIG. 3 shows a starting substrate to form a MuGFET based integrated circuit device, in accordance with the principles of the present teachings.

FIG. 4 shows a next process step from FIG. 3 to form a MuGFET based integrated circuit device, in accordance with the principles of the present teachings.

FIG. 5 shows a next process step from FIG. 4 to form a MuGFET based integrated circuit device, in accordance with the principles of the present teachings.

FIG. 6 shows a next process step from FIG. 5 to form a MuGFET based integrated circuit device, in accordance with the principles of the present teachings.

DESCRIPTION OF THE EMBODIMENTS

Figure 1:
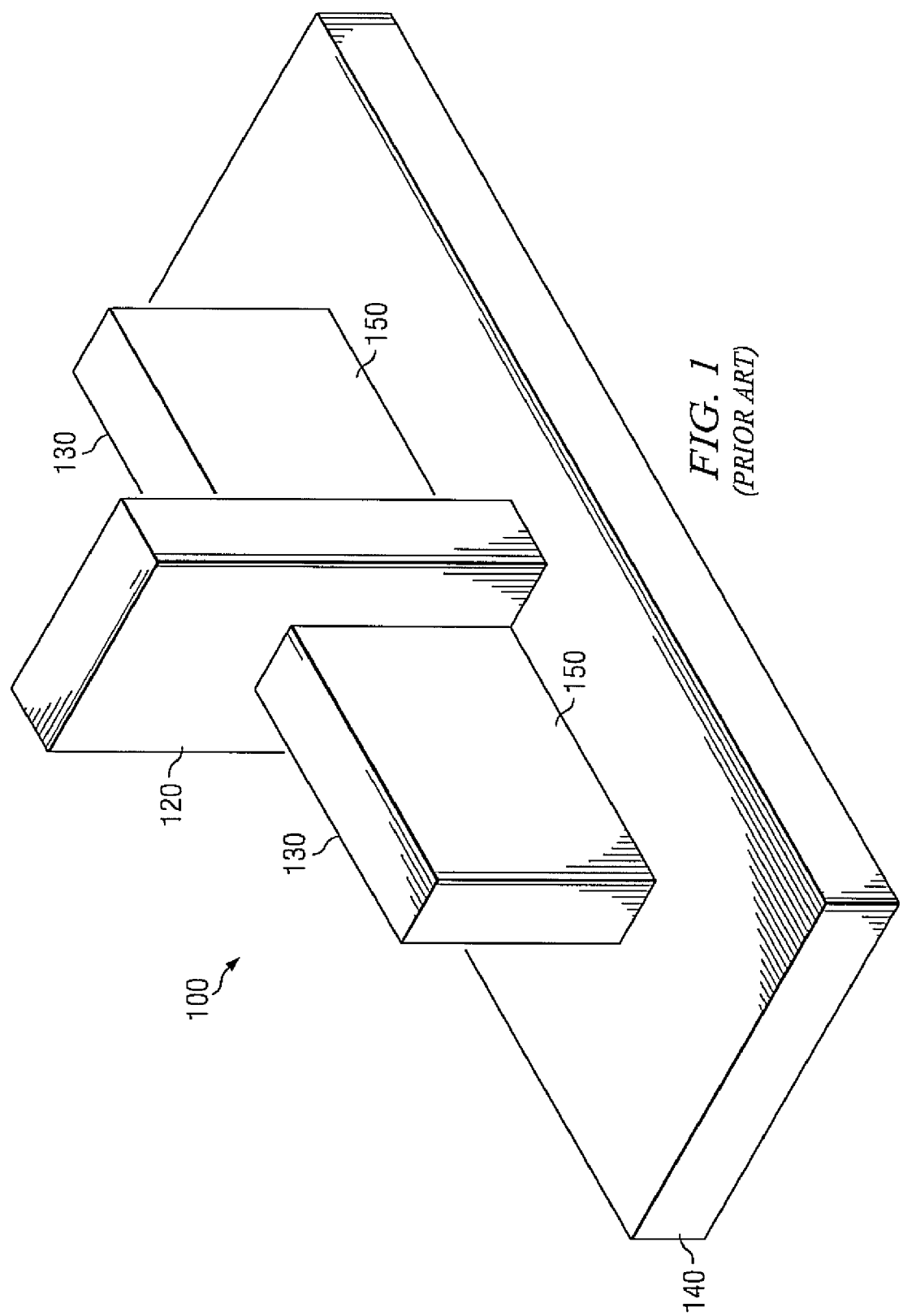
FIG. 1 shows a layout for a MuGFET.

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the teachings disclosed herein are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

The teachings herein overcome the need to have mixed rotations for a semiconductor integrated circuit device based on MuGFET technology. PMOS MuGFETs and a NMOS MuGFETs can now be laid out in a Manhattan layout, i.e., fins are rotated with respect to notches at 0° and 90°. In this manner, a semiconductor integrated circuit device can be constructed based on MuGFET technology having both PMOS MuGFETs and NMOS MuGFETs while minimizing area requirements on a substrate. Moreover, a lithographic process required to create the semiconductor integrated circuit device based on the MuGFET technology is simplified.

FIG. 3 shows a starting substrate to form a MuGFET based integrated circuit device, in accordance with the principles of the present teachings.

In particular, FIG. 3 shows a Direct Silicon Bonding (DSB) substrate 300 including two layers, i.e., a lower Si substrate that includes a 100 surface and an upper Si layer that includes a (110) surface. Lower Si substrate includes a (100) surface by virtue of its crystalline structure and upper Si layer includes a (110) surface by virtue of its crystalline structure. DSB substrate 300 is created using conventional techniques to create a DSB substrate 300.

FIG. 4 shows a next process step from FIG. 3 to form a MuGFET based integrated circuit device, in accordance with the principles of the present teachings.

In particular, FIG. 4 shows the DSB substrate 300 from FIG. 3 after it has been processed with conventional photomask or hardmask techniques and etching techniques to open a PMOS region for an amorphorization implant. DSB substrate 400 includes the region 430 that has been opened to implant a PMOS material within the upper Si layer 410. Lower Si substrate 420 is not processed during opening of the PMOS region for an amorphorization implant.

FIG. 5 shows a next process step from FIG. 4 to form a MuGFET based integrated circuit device, in accordance with the principles of the present teachings.

In particular, FIG. 5 shows the DSB substrate 400 from FIG. 4 after it has been processed to re-grow an amorphorized PMOS region within region 430. DSB substrate 500 includes the amorphorized PMOS region 530 within upper Si layer 510 that has been re-grown to re-crystalize it to include a 100 top surface. Lower Si substrate 520 is not processed during the re-growing of the amorphorized PMOS region 530.

FIG. 6 shows a next process step from FIG. 5 to form a MuGFET based integrated circuit device, in accordance with the principles of the present teachings.

In particular, FIG. 6 shows the DSB from FIG. 5 after it has been processed with conventional photomask or hardmask techniques and etching techniques to remove the upper Si layer 510 surrounding the amorphorized PMOS region 530 shown in FIG. 5.

Photomask or hardmask techniques and etching techniques are used to create an NMOS region 640 in addition to the PMOS region 630. Thus, in accordance with the teachings disclosed herein a PMOS fin including a (110) sidewall surface, i.e., channel, and a (100) top surface can be patterned with a NMOS fin including a (100) sidewall surface, i.e., channel, and a (110) top surface on a common substrate having a 100 surface at 0° and 90°.

Figure 7:
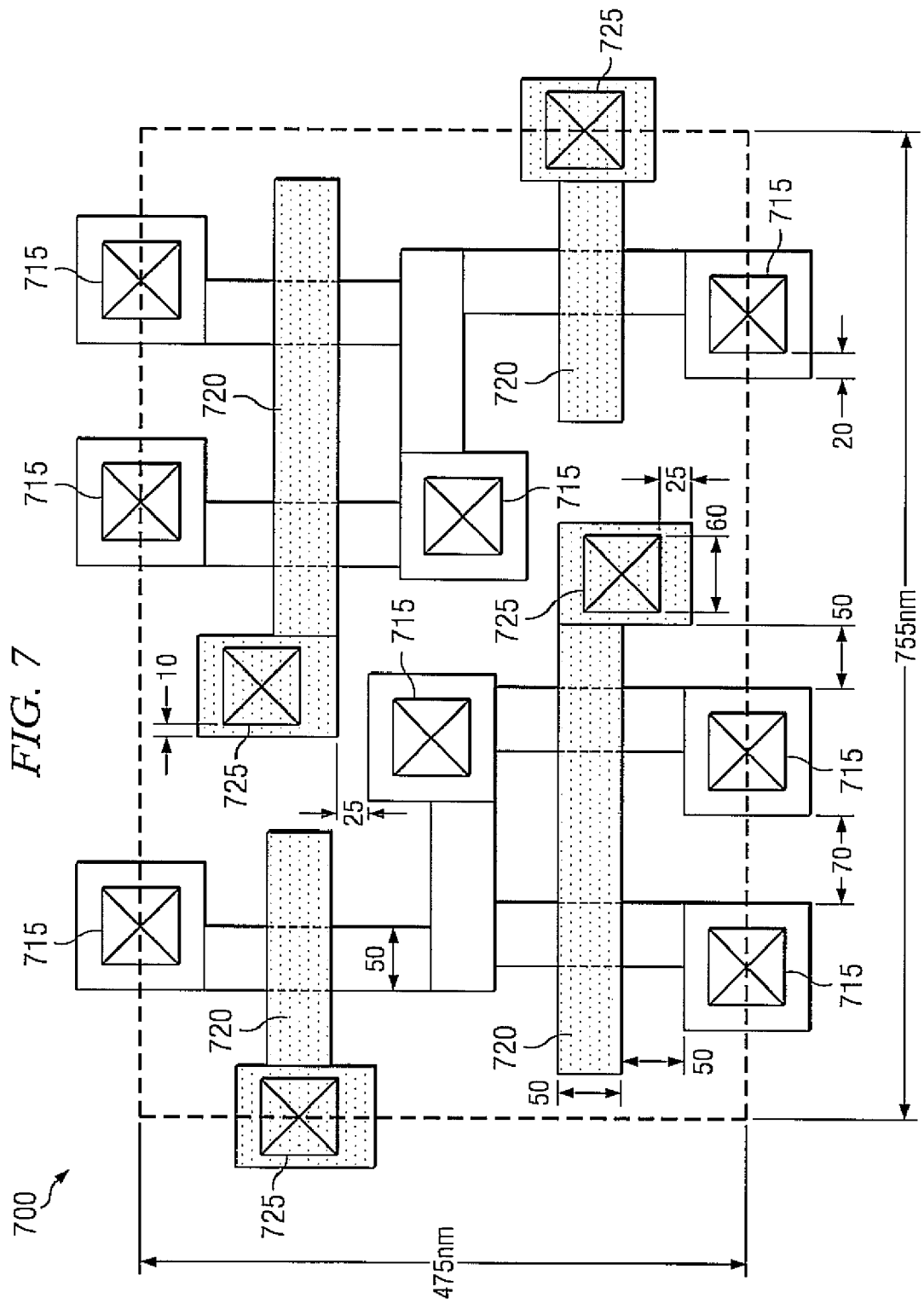
FIG. 7 shows an example top-level view of a Manhattan layout of a SRAM relying on MuGFET technology, in accordance with the principles of the present teachings.

FIG. 7 shows an example top-level view of a Manhattan layout of a SRAM relying on MuGFET technology, in accordance with the principles of the present teachings.

In particular, SRAM 700 is constructed in accordance with the principles of the present teachings using patterned fins as described above. The fins 710 are connected to other components of the SRAM 700 through contact patches 715. The notches 720 are connected to other components of the SRAM 700 through contact patches 725.

Measurements for the example SRAM 700 are taken from a centerline of the fin contact patches 715 and the centerline of the notch contact patches 725. Using industry standards for spacing between the various components of SRAM 700, the dimensions for the example SRAM 700 are approximately 475 nm by approximately 755 nm. Thus, the square layout area for the example SRAM 700 is approximately 358,625 $nm^2$.

Figure 2:
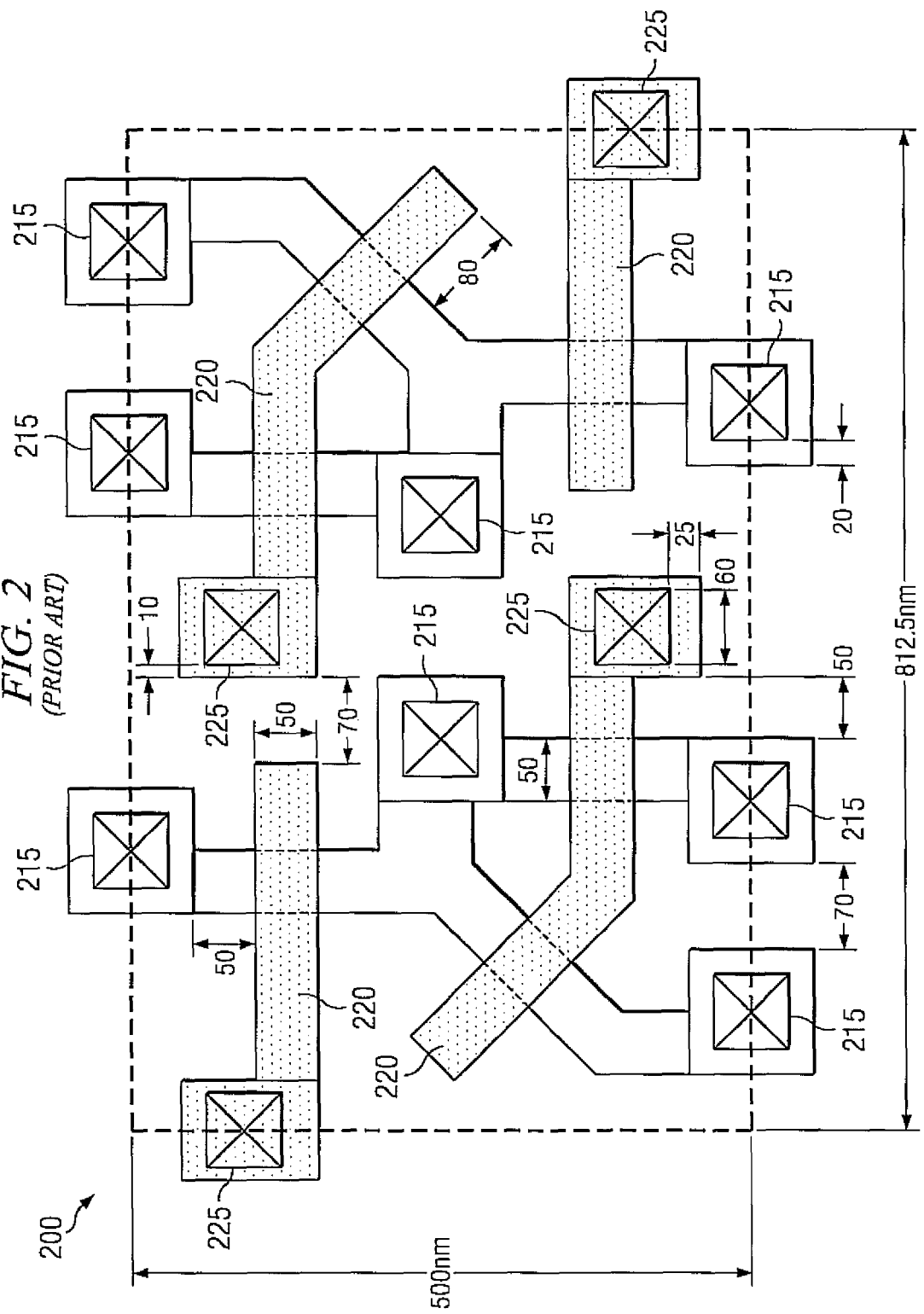
FIG. 2 shows an example top-level view of a non-Manhattan layout of a static random access memory (SRAM) relying on MuGFET technology.

As shown in FIG. 2 the square area of an example SRAM created using conventional MuGFET technology is 406,250 $nm^2$. The square area of an example SRAM shown in FIG. 7 created using MuGFET technology in accordance with the teachings disclosed herein is 358,625 $nm^2$. Thus, the area savings using MuGFET technology in accordance with the teachings of the present disclosed is 47,625 $nm^2$ or approximately a 25% reduction in area from using conventional layout of an integrated circuit relying on MuGFET technology.

The principles disclosed herein equally apply to creating a NMOS fin including a (110) sidewall surface and a (100) top surface can be patterned with a PMOS fin including a (100) sidewall surface and a (110) top surface on a common substrate having a (110) surface at 0° and 90°. Incorporating a (100) PMOS with a (100) NMOS is advantageous for SRAM write operations. During an SHAM write, it is advantageous to have a weak PMOS and a strong NMOS.

Thus, using a hybrid-orientation DSB substrate where the silicon top surface is (110), an NMOS fin surface is created in the horizontal direction (east-west) direction is (100) and the channel direction is <110>. For a PMOS fin, the PMOS region is first amorphorized and the (100) crystal is re-grown from the substrate to form a (100) surface region. When fins are cut into the (100) surface the sidewalls are (110)/<110> surface and direction.

Moreover, the principles disclosed herein can be applied to a DSB having both top surfaces as (100). In this case, the top layer's notch is rotated by 45° compared to the substrate. The NMOS channel direction would then be <100> instead of <110> as disclosed above. The area savings would be the same as with the teachings disclosed herein.

Moreover, the principles disclosed herein make a (111) surface accessible by aligning a fin layout to <112> direction on a substrate (110) surface. All three primary crystal surfaces are accessible to semiconductor devices using the principles disclosed herein.

Although the example disclosed herein is applied to a DSB substrate, the teachings disclosed herein can be applied to any hybrid orientation substrate consist of a (110) layer and a (100) layer.

While the teachings disclosed herein has been illustrated with respect to one or more implementations, alterations and/or modifications can be made to the illustrated examples without departing from the spirit and scope of the appended claims. In addition, while a particular feature of the teachings disclosed herein may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the teachings disclosed herein will be apparent to those skilled in the art from consideration of the specification and practice of the teachings disclosed herein. It is intended that the specification and examples be considered as exemplary only, with a true scope and spirit of the teachings disclosed herein being indicated by the following claims.

What is claimed is:

1. A method of forming an integrated circuit device comprised of a plurality of Multi-Gate Field Effect Transistors (MuGFETs), comprising:
    forming a first fin of a MuGFET on a Direct Silicon Bonding (DSB) substrate, the first fin comprising a channel of a first surface of a first crystal orientation; and
    forming a second fin of another MuGFET on the DSB substrate, the second fin comprising a channel on the DSB substrate oriented at one of 0° and 90° to the first fin and is comprised of a second surface of a second crystal orientation;
    wherein the first fin is a PMOS fin and is comprised of a (100) top surface.

2. The method according to claim 1, wherein the first crystal orientation is (110).

3. The method according to claim 2, wherein the second fin is an NMOS fin.

4. The method according to claim 3, wherein the second crystal orientation is (100).

5. The method according to claim 4, wherein a lower layer of the DSB substrate is comprised of a (100) surface.

6. The method according to claim 1, wherein the integrated circuit device is a static random access memory.

7. A method of forming an integrated circuit device comprised of a plurality of Multi-Gate Field Effect Transistors (MuGFETs), comprising:
    forming a first fin of a MuGFET on a Direct Silicon Bonding (DSB) substrate, the first fin comprising a channel of a first surface of a first crystal orientation; and
    forming a second fin of another MuGFET on the DSB substrate, the second fin comprising a channel on the DSB substrate oriented at one of 0° and 90° to the first fin and is comprised of a second surface of a second crystal orientation;
    wherein the second fin is an NMOS fin and is comprised of a (110) top surface.

8. An integrated circuit device comprised of a plurality of Multi-Gate Field Effect Transistors (MuGFETs), comprising:
    a Direct Silicon Bonding (DSB) substrate;
    a first fin of a first MuGFET on the DSB substrate, the first fin being comprised of a first surface of a first crystal orientation; and
    a second fin of second MuGFET on the DSB substrate, the second fin comprised of a second surface of a second crystal orientation and oriented at one of 0° and 90° to the first fin on the DSB substrate;
    wherein the first fin is a PMOS fin and is comprised of a (100) top surface.

9. The integrated circuit device according to claim 8, wherein the first crystal orientation is (110).

10. The integrated circuit device according to claim 9, wherein the second fin is an NMOS fin.

11. The integrated circuit device according to claim 10, wherein the second crystal orientation is (100).

12. The integrated circuit device according to claim 11, wherein a lower layer of the DSB substrate is comprised of a (100) surface.

13. The integrated circuit device according to claim 8, wherein the integrated circuit device is a static random access memory.

14. An integrated circuit device comprised of a plurality of Multi-Gate Field Effect Transistors (MuGFETs), comprising:
    a Direct Silicon Bonding (DSB) substrate;
    a first fin of a first MuGFET on the DSB substrate, the first fin being comprised of a first surface of a first crystal orientation; and
    a second fin of second MuGFET on the DSB substrate, the second fin comprised of a second surface of a second crystal orientation and oriented at one of 0° and 90° to the first fin on the DSB substrate;
    wherein the second fin is an NMOS fin and is comprised of a (110) top surface.

* * * * *